United States Patent
Lin et al.

(10) Patent No.: US 9,892,799 B1
(45) Date of Patent: Feb. 13, 2018

(54) READ VOLTAGE TRACKING METHOD, MEMORY STORAGE DEVICE AND MEMORY CONTROL CIRCUIT UNIT

(71) Applicant: PHISON ELECTRONICS CORP., Miaoli (TW)

(72) Inventors: Wei Lin, Taipei (TW); Yu-Cheng Hsu, Yilan County, TN (US); An-Cheng Liu, Taipei (TW)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/472,293

(22) Filed: Mar. 29, 2017

(30) Foreign Application Priority Data

Feb. 8, 2017 (TW) .............................. 106104161 A

(51) Int. Cl.
| | | |
|---|---|---|
| G11C 16/04 | (2006.01) | |
| G11C 16/34 | (2006.01) | |
| G11C 16/26 | (2006.01) | |
| G11C 16/10 | (2006.01) | |
| G11C 16/14 | (2006.01) | |
| G11C 29/12 | (2006.01) | |

(52) U.S. Cl.
CPC .......... *G11C 16/3427* (2013.01); *G11C 16/10* (2013.01); *G11C 16/14* (2013.01); *G11C 16/26* (2013.01); *G11C 29/12* (2013.01)

(58) Field of Classification Search
CPC ...... G11C 16/04; G11C 16/3427; G11C 16/10
USPC ........................................ 365/185.01–185.33
See application file for complete search history.

(56) References Cited

U.S. PATENT DOCUMENTS

| | | | | |
|---|---|---|---|---|
| 8,305,811 B2* | 11/2012 | Jeon | ....................... | G11C 16/20 365/185.12 |
| 9,019,770 B2* | 4/2015 | Lin | ....................... | G11C 16/26 365/185.12 |
| 2014/0153330 A1 | 6/2014 | Yoon et al. | | |
| 2014/0293696 A1* | 10/2014 | Lin | ....................... | G11C 16/26 365/185.12 |
| 2016/0225440 A1 | 8/2016 | Han et al. | | |

OTHER PUBLICATIONS

"Office Action of Taiwan Counterpart Application," dated Sep. 13, 2017, p. 1-p. 5, in which the listed references were cited.

\* cited by examiner

*Primary Examiner* — Harry W Byrne
(74) *Attorney, Agent, or Firm* — JCIPRNET

(57) ABSTRACT

A read voltage tracking method, a memory storage device and a memory control circuit unit are provided. The method includes obtaining a plurality of test read voltages corresponding to a plurality of voltage adjustment values, and obtaining an optimal read voltage according to the voltage adjustment values. The step of obtaining the test read voltages includes obtaining a second test read voltage by adjusting a first test read voltage according to a first voltage adjustment value, and obtaining a third test read voltage by adjusting the second test read voltage according to a second voltage adjustment value, and the first test read voltage is a preset test read voltage, the first voltage adjustment value is a preset voltage adjustment value, and the first voltage adjustment value is different from the second voltage adjustment value.

18 Claims, 8 Drawing Sheets

READ VOLTAGE TRACKING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 106104161, filed on Feb. 8, 2017. The entirety of the above-mentioned patent application is hereby incorporated by reference herein and made a part of this specification.

BACKGROUND

Technical Field

The present invention relates to a read voltage tracking method, and more particularly, relates to a read voltage tracking method for a rewritable non-volatile memory module, and a memory storage device and a memory control circuit unit using the method.

Description of Related Art

The growth of digital cameras, mobile phones, and MP3 players has been rapid in recent years. Consequently, the consumers' demand for storage media has increased tremendously. A rewritable non-volatile memory is one of the most adaptable memories for portable electronic products such as laptop computer due to its data non-volatility, low power consumption, small volume, non-mechanical structure and high read/write speed. A solid state drive (SSD) is a memory storage device which utilizes a flash memory module as a storage medium. For these reasons, flash memories have become an import part of the electronic industries.

In certain memory storage devices with error correction functions, data is only stored after being encoded. When the data is to be read, the memory storage device reads the data according to a preset read voltage and executes a decoding operation on the read data. However, as reliability of a memory module in the memory storage device is reduced over time, the data read by using the preset read voltage may have too many error bits which lead to a decoding failure. In general, the memory storage device finds an optimal read voltage by executing an optimal read voltage tracking operation.

In the optimal read voltage tracking operation, the memory storage device uses different read voltages to read the data in the memory module in order to find the optimal read voltage. Traditionally, the different read voltages for executing the optimal read voltage tracking operation are obtained by adjusting the preset read voltage according to a fixed voltage adjustment value. Because the fixed voltage adjustment value cannot be adjusted in response to the actual shifting condition of threshold voltage distribution, the found optimal read voltage may be inaccurate and efficiency in executing the optimal read voltage tracking operation may also be degraded.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The present invention is directed to a read voltage tracking method, a memory storage device and a memory control circuit unit, which are capable of improving efficiency and accuracy in tracking the optimal read voltage.

An exemplary embodiment of the invention provides a read voltage tracking method for a rewritable non-volatile memory module including a plurality of memory cells. The method includes obtaining a plurality of test read voltages, wherein the test read voltages correspond to a plurality of voltage adjustment values. The method also includes obtaining an optimal read voltage from the test read voltages according to the voltage adjustment values. The step of obtaining the test read voltages includes obtaining a second test read voltage among the test read voltages by adjusting a first test read voltage among the test read voltages according to a first voltage adjustment value corresponding to the first test read voltage, and obtaining a third test read voltage among the test read voltages by adjusting the second test read voltage according to a second voltage adjustment value corresponding to the second test read voltage. The first test read voltage is a preset test read voltage. The first voltage adjustment value is a preset voltage adjustment value. Also, the first voltage adjustment value is different from the second voltage adjustment value.

An exemplary embodiment of the invention provides a memory storage device, which includes a connection interface unit, a rewritable non-volatile memory module and a memory control circuit unit. The connection interface unit is configured to couple to a host system. The memory control circuit unit is coupled to the connection interface unit and the rewritable non-volatile memory module. The memory control circuit unit is configured to obtain a plurality of test read voltages and the test read voltages correspond to a plurality of voltage adjustment values. The memory control circuit unit is further configured to obtain an optimal read voltage from the test read voltages according to the voltage adjustment values. In the operation of obtaining the test read voltages, the memory control circuit unit is configured to obtain a second test read voltage among the test read voltages by adjusting a first test read voltage among the test read voltages according to a first voltage adjustment value corresponding to the first test read voltage and obtain a third test read voltage among the test read voltages by adjusting the second test read voltage according to a second voltage adjustment value corresponding to the second test read voltage. The first test read voltage is a preset test read voltage. The first voltage adjustment value is a preset voltage adjustment value. Also, the first voltage adjustment value is different from the second voltage adjustment value.

An exemplary embodiment of the invention provides a memory control circuit unit for controlling a rewritable non-volatile memory module. The memory control circuit unit includes a host interface, a memory interface and a memory management circuit. The host interface is configured to couple to a host system. The memory interface is configured to couple to the rewritable non-volatile memory module. The memory management circuit is coupled to the host interface and the memory interface. The memory management circuit is configured to obtain a plurality of test read voltages and the test read voltages correspond to a plurality of voltage adjustment values. The memory management circuit is further configured to obtain an optimal read voltage from the test read voltages according to the voltage adjustment values. In the operation of obtaining the test read voltages, the memory management circuit is configured to obtain a second test read voltage among the test read voltages by adjusting a first test read voltage among the test read voltages according to a first voltage adjustment value corresponding to the first test read voltage and obtain a third test read voltage among the test read voltages by adjusting the second test read voltage according to a second voltage adjustment value corresponding to the second test read voltage. The first test read voltage is a preset test read voltage. The first voltage adjustment value is a preset voltage adjustment value. Also, the first voltage adjustment value is different from the second voltage adjustment value.

Based on the above, the invention can be used to dynamically adjust the voltage adjustment value for obtaining the next test read voltage to be used according to the discrepancy value indicating the interval between two test read voltages used in succession. As a result, efficiency in searching for the optimal read voltage and accuracy of the found optimal read voltage can both be improved.

To make the above features and advantages of the invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
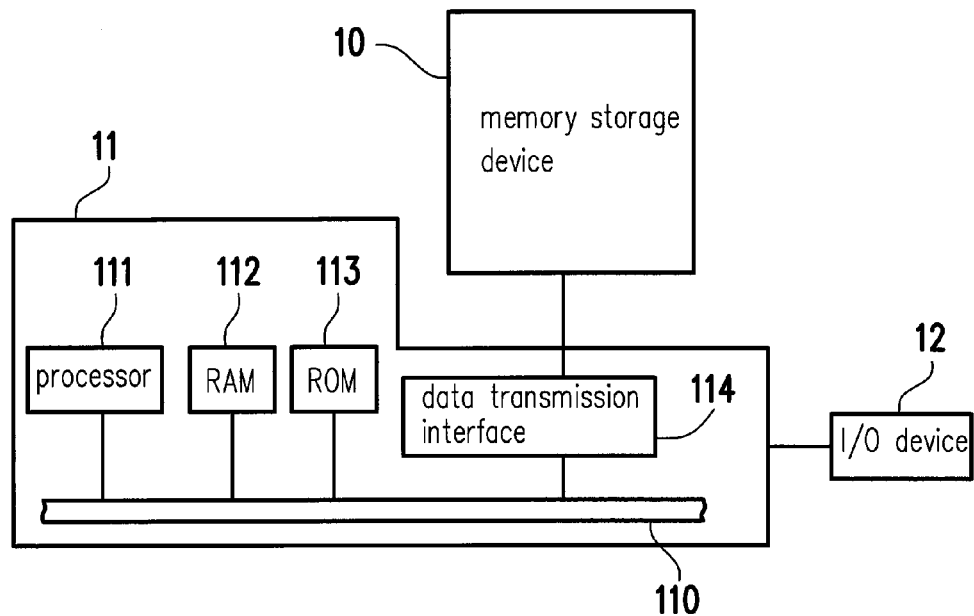
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (a.k.a. a memory storage system) includes a rewritable non-volatile memory module and a controller (a.k.a. a control circuit unit). The memory storage device is usually configured together with a host system so the host system can write data into the memory storage device or read data from the memory storage device.

Figure 2:
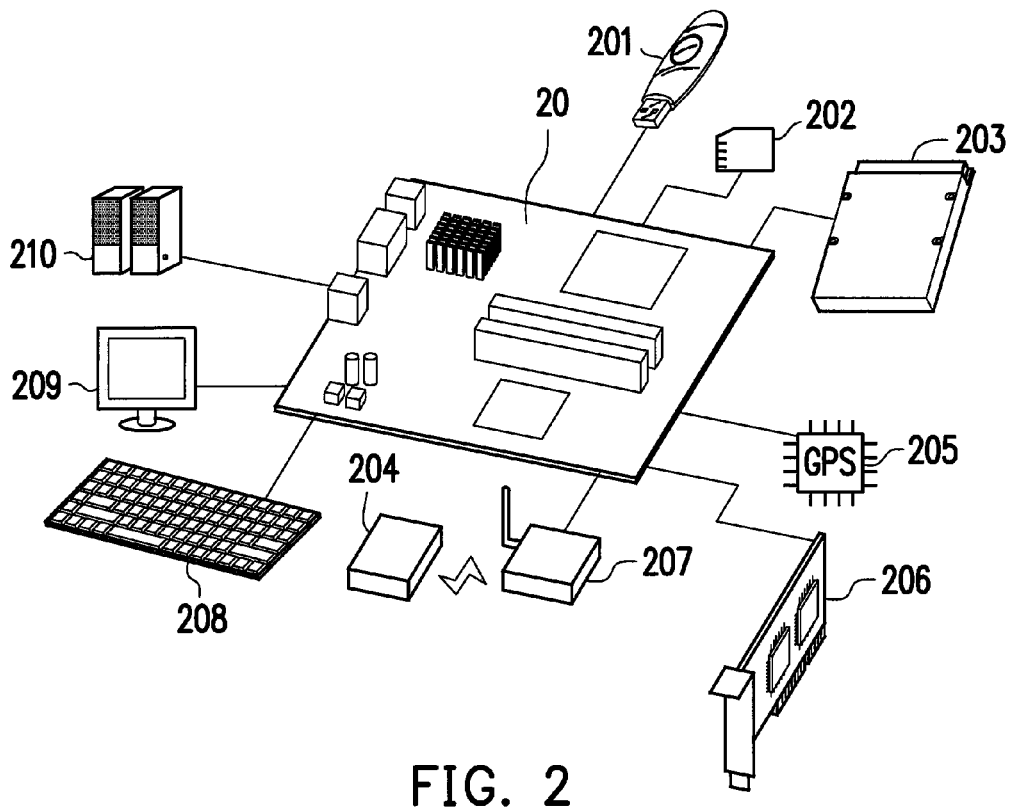
FIG. 2 is a schematic diagram illustrating a host system, a memory storage device and an I/O (input/output) device according to another exemplary embodiment of the invention.

FIG. 1 is a schematic diagram illustrating a host system, a memory storage device and an input/output (I/O) device according to an exemplary embodiment, and FIG. 2 is a schematic diagram illustrating a host system, a memory storage device and an input/output (I/O) device according to another exemplary embodiment.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can write data into the memory storage device 10 or read data from the memory storage device 10 via the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in a wired manner or a wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication Storage) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
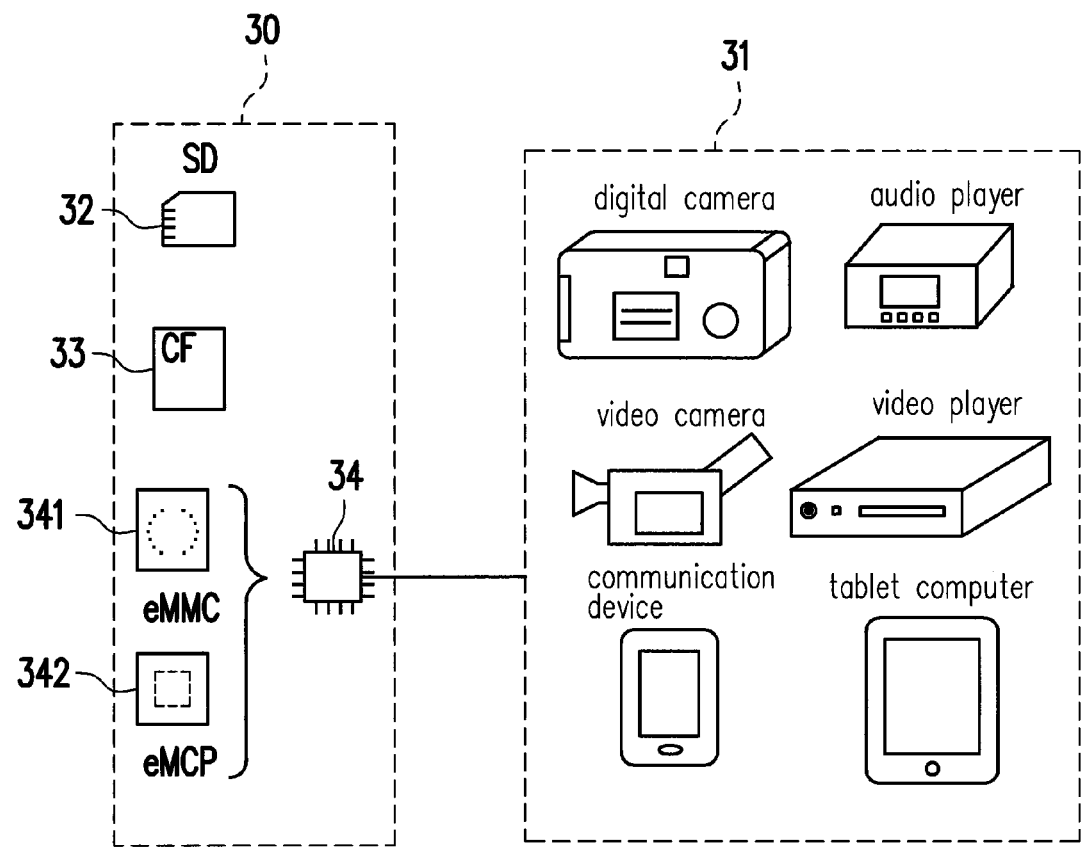
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in foregoing exemplary embodiment, FIG. 3 is a schematic diagram illustrating a host system and a memory storage device according to another exemplary embodiment. Referring to FIG. 3, in another exemplary embodiment, a host system 31 may also be a system including a digital camera, a video camera, a communication device, an audio player, a video player or a tablet computer, whereas a memory storage device 30 may be various non-volatile memory storage devices used by the host system, such as a SD card 32, a CF card 33 or an embedded storage device 34. The embedded storage device 34 includes various embedded storage devices capable of directly coupling a memory module onto a substrate of the host system, such as an eMMC (embedded MMC) 341 and/or an eMCP (embedded Multi Chip Package) 342.

Figure 4:
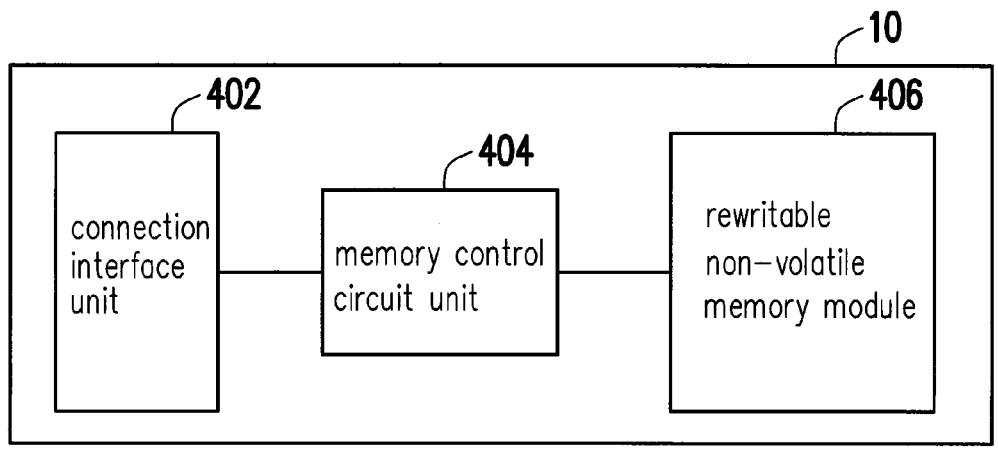
FIG. 4 is a schematic block diagram illustrating a host system and a memory storage device according to an exemplary embodiment of the invention.

FIG. 4 is a schematic block diagram illustrating a host system and a memory storage device according to one exemplary embodiment.

Referring to FIG. 4, the memory storage device 10 includes a connection interface unit 402, a memory control circuit unit 404 and a rewritable non-volatile memory module 406.

In the present exemplary embodiment, the connection interface unit 402 is compatible with a SATA (Serial Advanced Technology Attachment) standard.

Nevertheless, it should be understood that the present invention is not limited thereto. The connection interface unit 402 may also be compatible to a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a UHS-I (Ultra High Speed-I) interface standard, a UHS-II (Ultra High Speed-II) interface standard, a SD (Secure Digital) interface standard, a MS (Memory Stick) interface standard, a Multi-Chip Package interface standard, a MMC (Multi Media Card) interface standard, an eMMC (Embedded Multimedia Card) interface standard, a UFS (Universal Flash Storage) interface standard, an eMCP (embedded Multi Chip Package) interface standard, a CF (Compact Flash) interface standard, an IDE (Integrated Device Electronics) interface standard or other suitable standards. In the present exemplary embodiment, the connection interface unit 402 and the memory control circuit unit 404 may be packaged into one chip, or the connection interface unit 402 is disposed outside of a chip containing the memory control circuit unit.

The memory control circuit unit 404 is configured to execute a plurality of logic gates or control instructions which are implemented in a hardware form or in a firmware form and perform operations of writing, reading or erasing data in the rewritable non-volatile memory storage module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one data bit in one memory cell), a MLC (Multi Level Cell) NAND flash memory module (i.e., a flash memory module capable of storing two data bits in one memory cell), a TLC (Trinary Level Cell) NAND flash memory module (i.e., a flash memory module capable of storing three data bits in one memory cell), other flash memory modules or any memory module having the same features.

In the present exemplary embodiment, the memory cells of the rewritable non-volatile memory module 406 constitute a plurality of physical programming units, and the physical programming units constitute a plurality of physical erasing units. For example, the memory cells on the same word line constitute one or more physical programming units. If each of the memory cells can store more than one data bit, the physical programming units on the same word line can be at least classified into a lower physical programming unit and an upper physical programming unit. For instance, because each memory cell of the SLC NAND-type flash memory is capable of storing one bit of data, the memory cells arranged on the same word line are corresponding to one physical programming unit in the SLC NAND-type flash memory. In comparison with the SLC NAND-type flash memory, each memory cell of the MLC NAND-type flash memory can store two bits of data. Herein, each storage state (i.e., "11", "10", "01" and "00") includes a LSB (Least Significant Bit) and a MSB (Most Significant Bit). For example, in the storage states, the value of a first bit counted from the left is the LSB, and the value of a second bit counted from the left is the MSB. Accordingly, the memory cells arranged on the same word line can constitute two physical programming units. Herein, the physical programming unit composed of the LSBs of said memory cells is known as a lower physical programming unit, and the physical programming unit composed of the MSBs of said memory cells is known as an upper physical programming unit. Generally, in the MLC NAND flash memory, a writing speed of the lower physical programming unit is higher than a writing speed of the upper physical programming unit, and/or a reliability of the lower physical programming unit is higher than a reliability of the upper physical programming unit.

Similarly, each memory cell in the TLC NAND-type flash memory is capable of storing three bits data, wherein each storage state (i.e., "111", "110", "101", "100", "011", "010", "001" and "000") includes a first bit counted from the left being the LSB, a second bit counted from the left being a CSB (Center Significant Bit) and a third bit counted from the left being the MSB. Accordingly, the memory cells arranged on the same word line can constitute three physical programming units. Herein, the physical programming unit composed of the LSBs of said memory cells is known as a lower physical programming unit, the physical programming unit composed of the CSBs of said memory cells is known as a center physical programming unit, and the physical programming unit composed of the MSBs of said memory cells is known as an upper physical programming unit.

In the present exemplary embodiment, the physical programming unit is the minimum unit for programming. That is, the physical programming unit is the minimum unit for writing data. For example, the physical programming unit is a physical page or a physical sector. When the physical programming units are the physical page, these physical programming units usually include a data bit area and a redundancy bit area. The data bit area includes multiple physical sectors configured to store user data, and the redundant bit area is configured to store system data (e.g., an error correcting code). In the present exemplary embodiment, the data bit area includes 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

In the present exemplary embodiment, one or more bits in the rewritable non-volatile memory module 406 are stored by changing a voltage (referred to a threshold voltage hereafter) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage is also known as "writing data into the memory cell" or "programming the memory cell". Each of the memory cells in the rewritable non-volatile memory module 406 has a plurality of storage states depended on changes in the threshold voltage. The storage state to which the memory cell belongs may be determined by applying a read voltage to the memory cell, so as to obtain the one or more bits stored in the memory cell.

Figure 5:
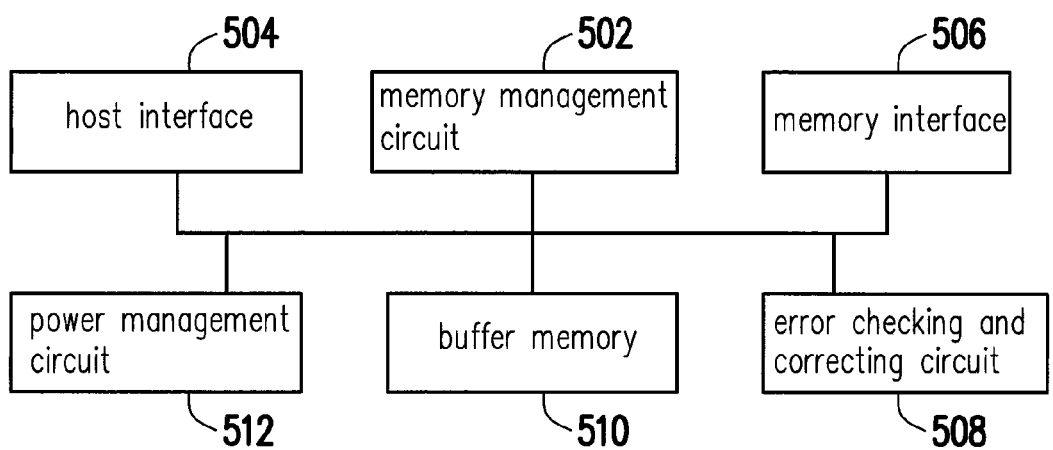
FIG. 5 is a schematic block diagram illustrating a memory control circuit unit according to an exemplary embodiment of the invention.

FIG. 5 is a schematic block diagram illustrating a memory control circuit unit according to an exemplary embodiment.

Referring to FIG. 5, the memory control circuit unit 404 includes a memory management circuit 502, a host interface 504, a memory interface 506, a buffer memory 510, a power management circuit 512, and an error checking and correcting circuit 508.

The memory management circuit 502 is configured to control overall operations of the memory control circuit unit 404. Specifically, the memory management circuit 502 has a plurality of control instructions and the control instructions are executed to execute various operations such as writing, reading and erasing data during operation of the memory storage device 10.

In the present exemplary embodiment, the control instructions of the memory management circuit 502 are implemented in form of firmware. For instance, the memory management circuit 502 has a microprocessor unit (not illustrated) and a read-only memory (not illustrated), and the control instructions are burnt into the read-only memory. During operation of the memory storage device 10, the control instructions are executed by the microprocessor to perform operations of writing, reading or erasing data.

In another exemplary embodiment of the invention, the control instructions of the memory management circuit 502 may also be stored, in form of program codes, into a specific area (e.g., a system area in the memory module exclusively for storing the system data) of the rewritable non-volatile memory module 406. In addition, the memory management circuit 502 has a microprocessor unit (not illustrated), a ROM (not illustrated) and a RAM (not illustrated). Particularly, the ROM has an activate code, which is executed by the microprocessor unit to load the control instructions stored in the rewritable non-volatile memory module 406 to the RAM of the memory management circuit 502 when the memory control circuit unit 404 is enabled. Thereafter, the control instructions are executed by the microprocessor unit to perform operations of writing, reading or erasing data.

Further, in another exemplary embodiment of the invention, the control instructions of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory management circuit is configured to manage the physical erasing units of the rewritable non-volatile memory module 406; the memory writing circuit is configured to issue a write command to the rewritable non-volatile memory module 406 in order to write data into the rewritable non-volatile memory module 406; the memory reading circuit is configured to issue a read command to the rewritable non-volatile memory module 406 in order to read data from the rewritable non-volatile memory module 406; the memory erasing circuit is configured to issue an erase command to the rewritable non-volatile memory module 406 in order to erase data from the rewritable non-volatile memory module 406; the data processing circuit is configured to process both the data to be written into the rewritable non-volatile memory module 406 and the data to be read from the rewritable non-volatile memory module 406.

The host interface 504 is coupled to the memory management circuit 502 and configured to couple to the connection interface unit 402, so as to receive and identify commands and data sent from the host system 11. In other words, the commands and data transmitted by the host system 11 are transmitted to the memory management circuit 502 via the host interface 504. In the present exemplary embodiment, the host interface 504 is compatible with the SATA standard. Nevertheless, it should be understood that the invention is not limited thereto. The host interface 504 may also be PATA standard, IEEE 1394 standard, PCI Express standard, USB standard, UHS-I interface standard, UHS-II interface standard, SD standard, MS standard, MMC standard, CF standard, IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506.

The buffer memory 510 is coupled to the memory management circuit 502 and configured to temporarily store data and commands from the host system 11 or data from the rewritable non-volatile memory module 406.

The power management unit 512 is coupled to the memory management circuit 502 and configured to control a power of the memory storage device 10.

The error checking and correcting circuit 508 is coupled to the memory management circuit 502 and configured to execute an error checking and correcting procedure to ensure the data integrity. Specifically, when the memory management circuit 502 receives a write command from the host system 11, the error checking and correcting circuit 508 generates an ECC code (Error Checking and Correcting Code) for the data corresponding to the write command, and the memory management circuit 502 writes the data and the ECC code corresponding to the write command into the rewritable non-volatile memory module 406. Later, when the memory management circuit 502 reads the data from the rewritable non-volatile memory module 406, the error checking and correcting code corresponding to the data is also read, and the error checking and correcting circuit 508 may execute the error checking and correcting procedure for the read data according to the error checking and correcting code.

In the following description, the operations executed by the memory management circuit 502, the host interface 504, the memory interface 506, the buffer memory 510, the power management circuit 512 and the error checking and correcting circuit 508 may also be referred to as being executed by the memory control circuit unit 404.

Figure 6:
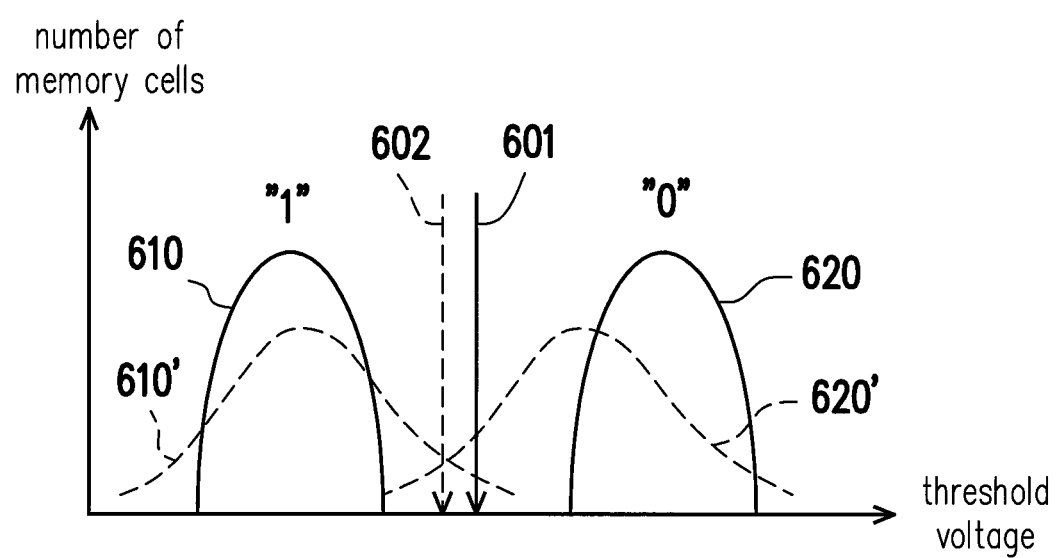
FIG. 6 is a schematic diagram illustrating threshold voltage distribution of the memory cells according to an exemplary embodiment of the invention.

FIG. 6 is a schematic diagram illustrating threshold voltage distribution of the memory cells according to an exemplary embodiment of the invention, where a horizontal axis represents the threshold voltage of the memory cells, and a vertical axis represents a number of the memory cells.

Referring to FIG. 6, it is assumed that a state 610 corresponds to the bit "1", and a state 620 corresponds to the bit "0". If the threshold voltage of one specific memory cell belongs to the state 610, what stored by the specific memory cell is the bit "1"; otherwise, if the threshold voltage of one specific memory cell belongs to the state 620, what stored by the specific memory cell is the bit "0". It is noted that, in the present exemplary embodiment, one state of the threshold voltage distribution corresponds to one bit value (i.e., "0" or "1"), and the threshold voltage distribution of the memory cell includes two possible states. However, in other exemplary embodiments, each state in the threshold voltage distribution may also correspond to a plurality of bit values and the threshold voltage distribution of the memory cell may also include four, eight or any number of possible states. In addition, the bit represented by each state is not particularly limited by the invention. For example, in another exemplary embodiment, it is also possible that the state 610 corresponds to the bit "0" and the state 620 corresponds to the bit "1".

In the present exemplary embodiment, when it is intended to read the data from the rewritable non-volatile memory module 406, the memory management circuit 502 transmits a read command sequence to the rewritable non-volatile memory module 406. The read command sequence is configured to instruct the rewritable non-volatile memory module 406 to read data from a plurality of memory cells (referred to first memory cells hereafter). In the present exemplary embodiment, the first memory cells belong to the same physical programming unit. However, in another exemplary embodiment, the first memory cells may also belong to different physical programming units. In the case where the threshold voltage distribution is not shifted, the threshold voltage distribution includes a state 610 and a state 620. According to this read command sequence, the rewritable non-volatile memory module 406 can read data form the first memory cells using a read voltage 601 in FIG. 6. The read voltage 601 is a preset read voltage that can be used to identify the state 610 and the state 620 of the first memory cells. In other words, memory cells having the threshold voltage less than the read voltage 601 among the first memory cells are turned on so the bit "1" is read by the memory management circuit 502. On the other hand, memory cells having the threshold voltage greater than the read voltage 601 among the first memory cells are not turned on so the bit "0" is read the memory management circuit 502.

Yet, owing to different factors (e.g., data storage over a long period of time, wearing of memory cells, read-disturb, etc.), the threshold voltage distribution of the first memory cells may be shifted. Consequently, the storage states of the first memory cell cannot be correctly identified by using the read voltage 601 (e.g., the preset read voltage).

It is assumed that the threshold voltage distribution of the first memory cells is already shifted, and the states 610 and 620 of the threshold voltage distribution are shifted to states 610' and 620', respectively. In this case, some memory cells among the first memory cells should store the bit "1" (which belongs to the state 610') but showing the threshold voltage greater than the applied read voltage 601; or some memory cells among the first memory cells should store the bit "0" (which belongs to the state 620') but showing the threshold voltage less than the applied read voltage 601. In other words, some bits among the data read by applying the read voltage 601 can include errors. Therefore, after receiving the data read from the rewritable non-volatile memory module 406, the error checking and correcting circuit 508 reads the error correcting code corresponding to the read data in order to verify whether the read data does include errors. When it is determined that the read data includes errors, the error checking and correcting circuit 508 executes a decoding operation to attempt correcting errors in the data. If errors in the read data cannot be correctly decoded by the error checking and correcting circuit 508 (e.g., the number of error bits of the read data exceeds a protection capability of the error checking and correcting circuit 508), the read data cannot be correctly corrected and thus error data is generated.

In the present exemplary embodiment, when the read data cannot be correctly corrected, the memory management circuit 502 executes an optimal read voltage tracking operation to find an optimal read voltage suitable for the shifted threshold voltage distribution. During an execution process of the optimal read voltage tracking operation, the memory management circuit 502 uses a plurality of test read voltages to read the memory cells in order to find the optimal read voltage. In particular, the memory management circuit 502 dynamically adjusts a voltage adjustment value for obtaining the next test read voltage to be used.

Specifically, the memory management circuit 502 decides the voltage adjustment value for obtaining the next test read voltage to be used according to two test read voltages used in succession. In the present exemplary embodiment, the memory management circuit 502 gives a read command sequence which instructs to apply the test read voltage to the first memory cells and determine a quantity (referred to a first-state memory cell quantity hereafter) of memory cells identified as in a specific state (referred to a first state hereafter). Next, the memory management circuit 502 calculates one discrepancy value according to the two first-state memory cell quantities determined by the two test read voltages used in succession. Then, the memory management circuit 502 decides one new voltage adjustment value according to the discrepancy value, and obtains the next test read voltage to be used according to this new voltage adjustment value.

Figure 7:
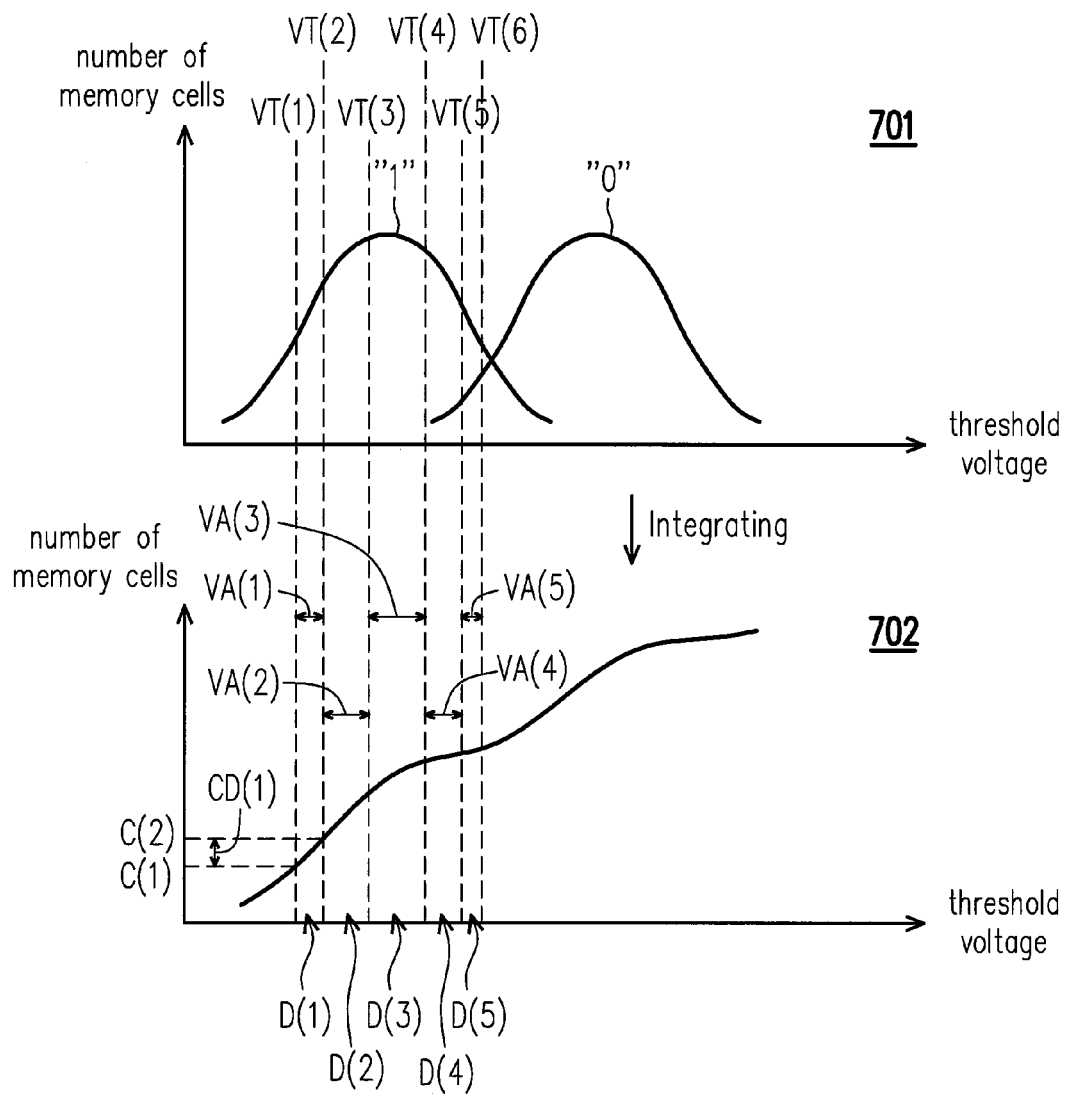
FIG. 7 is a schematic diagram for tracking read voltage according to an exemplary embodiment of the invention.

FIG. 7 is a schematic diagram for tracking read voltage according to an exemplary embodiment of the invention, where a horizontal axis represents the threshold voltage of the memory cells, and a vertical axis represents a number of the memory cells. Herein, a distribution map 701 represents a shifted state of the threshold voltage distribution of the first memory cells in FIG. 6, and a distribution map 702 is a schematic diagram obtained after executing an integral operation based on the threshold voltage distribution in the distribution map 701 and used to indicate a total quantity of memory cells identified as in the state "1" (or "turned on") when being applied with different threshold voltages.

Referring FIG. 7, it is assumed that the memory management circuit 502 is preset to use 6 test read voltages to find the optimal read voltage during the execution process of the optimal read voltage tracking operation. In the present exemplary embodiment, the memory management circuit 502 obtains another test read voltage by adjusting each test read voltage according to the voltage adjustment values corresponding to the test read voltages.

In the present exemplary embodiment, a first test read voltage (e.g., a test read voltage VT(1)) for executing the optimal read voltage tracking operation and a voltage adjustment value (e.g., a voltage adjustment value VA(1)) corresponding to the first test read voltage may be a preset test read voltage and a preset voltage adjustment value respectively as decided before the memory storage device 10 leaves the factory. The preset test read voltage and the preset voltage adjustment value may be values set by estimating the shifting condition of the threshold of the memory cells. For example, the first test read voltage may be preset to be a voltage value corresponding to the leftmost point on the non-shifted threshold voltage distribution. Taking FIG. 6 and FIG. 7 for example, the test read voltage VT(1) (i.e., the first test read voltage) may be preset to be a threshold voltage value corresponding to the leftmost point on the non-shifted threshold voltage distribution 610 of the first memory cells. Then, the memory management circuit 502 can obtain a test read voltage VT(2) by using the preset voltage adjustment value VA(1) to adjust the test read voltage VT(1). After obtaining the test read voltage VT(2), the memory management circuit 502 can obtain voltage adjustment values VA(2) to VA(5) and test read voltages VT(3) to VT(6) to be subsequently used according to the method for calculating the discrepancy value described above.

In addition, the memory management circuit 502 also calculates a quantity of memory cells identified as in the state "1" when one test read voltage is being applied. For instance, the memory management circuit 502 uses the test read voltage VT(1) to read data from first memory cells, and determines a quantity C(1) of the memory cells identified as in the state "1" according to the read data. Next, the memory management circuit 502 obtains the next test read voltage VT(2) by using the voltage adjustment value VA(1) corresponding to the test read voltage VT(1) to adjust the test read voltage VT(1), and determines a quantity C(2) of memory cells identified as in the state "1" according to the read data.

In the present exemplary embodiment, the memory management circuit 502 further calculates a discrepancy value D(1) indicating the interval between the test read voltage VT(1) and the test read voltage VT(2) according to the quantity C(1) of memory cells and the quantity C(2) of memory cells. For example, in an exemplary embodiment, the memory management circuit 502 calculates a numerical difference CD(1) between the quantity C(1) of memory cells and the quantity C(2) of memory cells to be the discrepancy value D(1).

However, the invention is not limited thereto. In another exemplary embodiment, the memory management circuit 502 can further calculate a ratio of the numerical difference CD(1) to the voltage adjustment value VA(1) (i.e., a slope of the interval between the test read voltage VT(1) and the test read voltage VT(2) in the distribution map 702) to be the discrepancy value D(1). In other words, the memory management circuit 502 can also calculate an increment in the quantity of the memory cells within a unit voltage interval between the test read voltage VT(1) and the test read voltage VT(2) to be the discrepancy value D(1) indicating the interval between the test read voltage VT(1) and the test read voltage VT(2).

Subsequently, the memory management circuit 502 decides the voltage adjustment value for obtaining the next test read voltage to be used according to the obtained discrepancy value. For example, when the test read voltage VT(2) is currently being used, the memory management circuit 502 decides the voltage adjustment value VA(2) corresponding to the test read voltage VT(2) according to the discrepancy value D(1). Based on that, the memory management circuit 502 can obtain the next test read voltage VT(3) to be used by adjusting the test read voltage VT(2) according to the voltage adjustment value VA(2). In the present exemplary embodiment, the memory management circuit 502 sets a relatively larger value for the voltage adjustment value VA(2) when determining that the discrepancy value D(1) is larger. Conversely, the memory management circuit 502 sets a relatively smaller value for the voltage adjustment value VA(2) when determining that the discrepancy value is smaller.

For example, in an exemplary embodiment, the memory management circuit 502 can preset one or more preset discrepancy thresholds and preset corresponding preset adjustment ratios. The memory management circuit 502 can decide the preset adjustment ratio to be used according to whether the discrepancy value is greater than the preset discrepancy threshold. For example, the memory management circuit 502 can preset one specific voltage adjustment threshold. If the discrepancy value D(1) is greater than or equal to the specific preset discrepancy threshold, the memory management circuit 502 can multiply the voltage adjustment value VA(1) by a first preset adjustment ratio to obtain the voltage adjustment value VA(2). On the other hand, if the discrepancy value D(1) is less than the specific preset discrepancy threshold, the memory management circuit 502 can multiply the voltage adjustment value VA(1) by a second preset adjustment ratio to obtain the voltage adjustment value VA(2). The first preset adjustment ratio can be set to be a value greater than 1, whereas the second adjustment value may be set to be a value less than 1. In this way, the memory management circuit 502 can obtain the larger voltage adjustment value according to a scale-up ratio when determining that the discrepancy value is larger, and obtains the smaller voltage adjustment value according to a scale-down ratio when determining that the discrepancy value is smaller.

Moreover, in another exemplary embodiment, the memory management circuit 502 can decide the voltage adjustment value for obtaining the next test read voltage to be used by comparing sizes of two discrepancy values. For example, it is assumed that the test read voltage VT(3) is currently being used, and a discrepancy value D(2) is a discrepancy value indicating the interval between the test read voltage VT(3) and the test read voltage VT(2). If the discrepancy value D(2) is greater than the discrepancy value D(1), the memory management circuit 502 sets the voltage adjustment value VA(3) corresponding to the test read voltage VT(3) to be a value grater than the voltage adjustment value VA(2). The memory management circuit 502 can multiply the voltage adjustment value VA(2) by an adjustment ratio greater than 1 to obtain the voltage adjustment value VA(3). In addition, the memory management circuit 502 may also calculate a ratio of the discrepancy value D(2) to discrepancy value D(1) to be the adjustment ratio, and then multiply the voltage adjustment value VA(2) by calculated adjustment ratio to obtain the voltage adjustment value VA(3). Then, the memory management circuit 502 can obtain the next test read voltage VT(4) to be used by adjusting the test read voltage VT(3) according to the voltage adjustment value VA(3).

In particular, the memory management circuit 502 can also preset one voltage adjustment threshold, and the voltage adjustment value is a value not greater than that voltage adjustment threshold. For example, it is assumed that a voltage adjustment value V is decided by the memory management circuit 502 according to the discrepancy value. If the memory management circuit 502 determines that the decided voltage adjustment value V is greater than the voltage adjustment threshold, the memory management circuit 502 sets the voltage adjustment values V to be the voltage adjustment threshold. By doing so, the voltage adjustment value may be controlled within a specific range.

It should be noted that, aforementioned method for deciding the voltage adjustment value according to the discrepancy value is merely an example, and the present invention is not limited thereto. In fact, the memory management circuit 502 may also use other different methods to set the voltage adjustment value to be the larger value when determining that the discrepancy value is larger and set the voltage adjustment value to the smaller value when determining that the discrepancy value is smaller.

Based on above description, in the exemplary embodiment of FIG. 7, the memory management circuit 502 can obtain the test read voltages VT(2) to VT(6) by using the different voltage adjustment values VA(1) to VA(5). Then, the memory management circuit 502 can decide the optimal read voltage according to the voltage adjustment values VA(1) to VA(5). In an exemplary embodiment, the memory management circuit 502 may compare sizes of the discrepancy values D(1) to D(5) and determine that the discrepancy value D(5) is a minimal discrepancy value such that the test read voltage VT(6) is decided to be the optimal read voltage. Further, in another exemplary embodiment, the memory management circuit 502 may compare sizes of the voltage adjustment values VA(1) to VA(5) and determine that the voltage adjustment value VA(5) is the minimal adjustment value such that the test read voltage VT(6) is determined to be the optimal read voltage.

Figure 8:
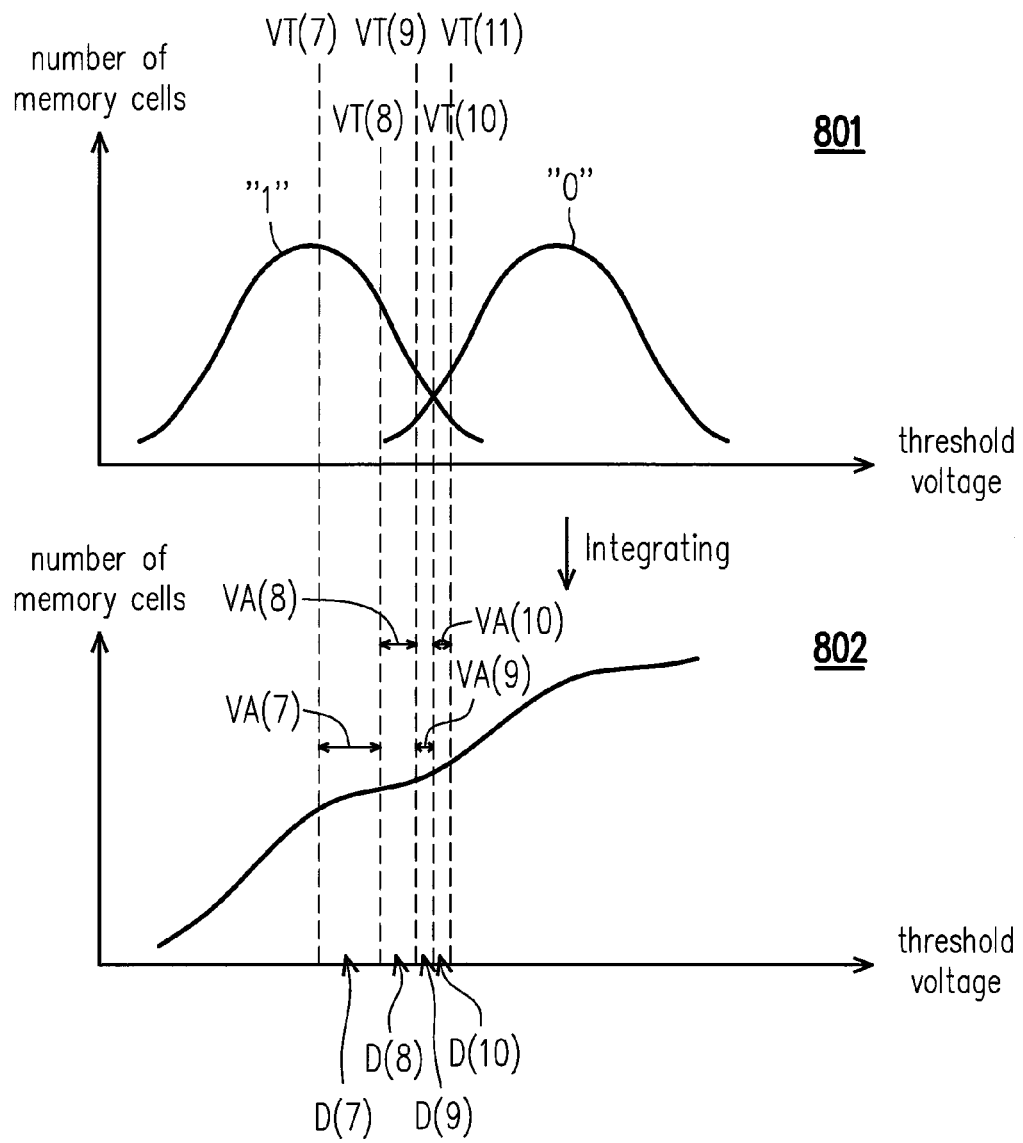
FIG. 8 is a schematic diagram for tracking read voltage according to another exemplary embodiment of the invention.

FIG. 8 is a schematic diagram for tracking read voltage according to another exemplary embodiment of the invention, where a horizontal axis represents the threshold voltage of the memory cells, and a vertical axis represents a number of the memory cells. Herein, a distribution map 801 represents a threshold voltage distribution of memory cells, and a distribution map 802 is a schematic diagram obtained after executing an integral operation based on the threshold voltage distribution in the distribution map 801 and used to indicate a total quantity of memory cells identified as in the state "1" when being applied with different threshold voltages.

Referring to FIG. 8, in the exemplary embodiment of FIG. 8, it is assumed that during the execution process of the optimal read voltage tracking operation, the memory management circuit 502 is preset to find the optimal read voltage by using 6 test read voltages and use a method similar to that of FIG. 7 to obtain test read voltages and voltage adjustment values. In the present exemplary embodiment, the memory management circuit 502 obtains the discrepancy value by calculating the slope of the interval formed by two read voltages used in succession based on the distribution map 802.

Unlike the exemplary embodiment of FIG. 7, each time when a new test read voltage is obtained, the memory management circuit 502 can immediately determine whether the discrepancy value obtained according to the obtained new test read voltage is currently the minimal discrepancy value in the exemplary embodiment of FIG. 8. If the discrepancy value obtained according to the obtained new test read voltage is currently the minimal discrepancy value, the memory management circuit 502 records the obtained new test read voltage to be a preset optimal read voltage. For example, the memory management circuit 502 records the preset optimal read voltage in one temporary table in the buffer memory 510. When the new test read voltage is obtained again and the calculated discrepancy value is currently determined as greater than the minimal discrepancy value, the memory management circuit 502 can determine that the optimal read voltage is found and set the recorded preset optimal read voltage to be the optimal read voltage.

Referring to FIG. 8, for instance, the memory management circuit 502 obtains a new test read voltage VT(8) by using a voltage adjustment value VA(7) to adjust a test read voltage VT(7), and calculates a discrepancy value D(7) based on the test read voltage VT(7) and the test read voltage VT(8). At this time, the memory management circuit 502 determines that the discrepancy value D(7) is currently the minimal discrepancy value and records the test read voltage VT(8). Next, the memory management circuit 502 decides a voltage adjustment value VA(8) corresponding to the test read voltage VT(8) according to the discrepancy value D(7). Then, the memory management circuit 502 obtains a new test read voltage VT(9) by using the voltage adjustment value VA(8) to adjust the test read voltage VT(8), and calculates a discrepancy value D(8) based on the test read voltage VT(9) and the test read voltage VT(8). At this time, the memory management circuit 502 determines that the discrepancy value D(8) is less than the discrepancy value D(7) and thus updates the recorded preset optimal read voltage into the test read voltage VT(9). Then, the memory management circuit 502 continues to execute the optimal read voltage tracking operation.

Next, the memory management circuit 502 decides a voltage adjustment value VA(9) corresponding to the test read voltage VT(9) according to the discrepancy value D(8). Then, the memory management circuit 502 obtains a new test read voltage VT(10) by using the voltage adjustment value VA(9) to adjust the test read voltage VT(9), and calculates a discrepancy value D(9) based on the test read voltage VT(10) and the test read voltage VT(9). At this time, the memory management circuit 502 determines that the discrepancy value D(9) is less than the discrepancy value D(8) and thus updates the recorded preset optimal read voltage into the test read voltage VT(10). Then, the memory management circuit 502 continues to execute the optimal read voltage tracking operation.

Next, the memory management circuit 502 decides a voltage adjustment value VA(10) corresponding to the test read voltage VT(10) according to the discrepancy value D(9). Then, the memory management circuit 502 obtains a new test read voltage VT(11) by using the voltage adjustment value VA(10) to adjust the test read voltage VT(10), and calculates a discrepancy value D(10) based on the test read voltage VT(11) and the test read voltage VT(10). At this time, the memory management circuit 502 determines that the discrepancy value D(10) is greater than the discrepancy value D(9). Therefore, the memory management circuit 502 determines that the optimal read voltage is found and sets the recorded preset optimal read voltage (i.e., the test read voltage VT(10)) to be the optimal read voltage.

In the exemplary embodiment of FIG. 8, with only 5 test read voltages VT(7) to VT(11) used, the memory management circuit 502 can then determine whether the optimal read voltage is found according to variation of the discrepancy values. In other words, during the execution process of the optimal read voltage tracking operation, the memory management circuit 502 can find the optimal read voltage by using fewer test read voltages.

In the exemplary embodiments of FIG. 7 and FIG. 8, after finding the optimal read voltage, the memory management circuit 502 can record the optimal read voltage in the rewritable non-volatile memory module 406. For example, the memory management circuit 502 can record the preset optimal read voltage a retry table.

Figure 9:
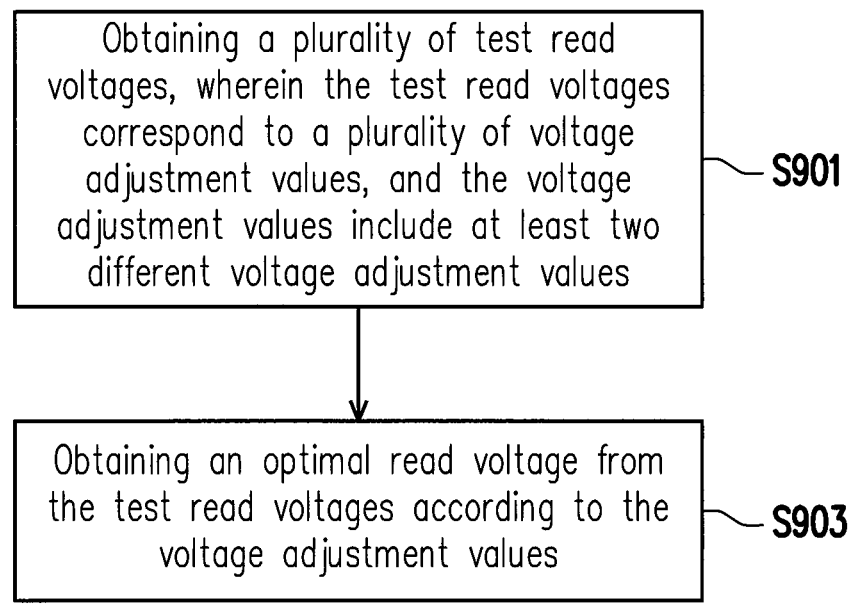
FIG. 9 is a flowchart illustrating a read voltage tracking method according to an exemplary embodiment of the invention.

FIG. 9 is a flowchart illustrating a read voltage tracking method according to an exemplary embodiment of the invention.

Referring to FIG. 9, in step S901, the memory management circuit 502 obtains a plurality of test read voltages, wherein the test read voltages correspond to a plurality of voltage adjustment values, and the voltage adjustment values include at least two different voltage adjustment values.

In step S903, the memory management circuit 502 obtains an optimal read voltage from the test read voltages according to the voltage adjustment values.

Figure 10:
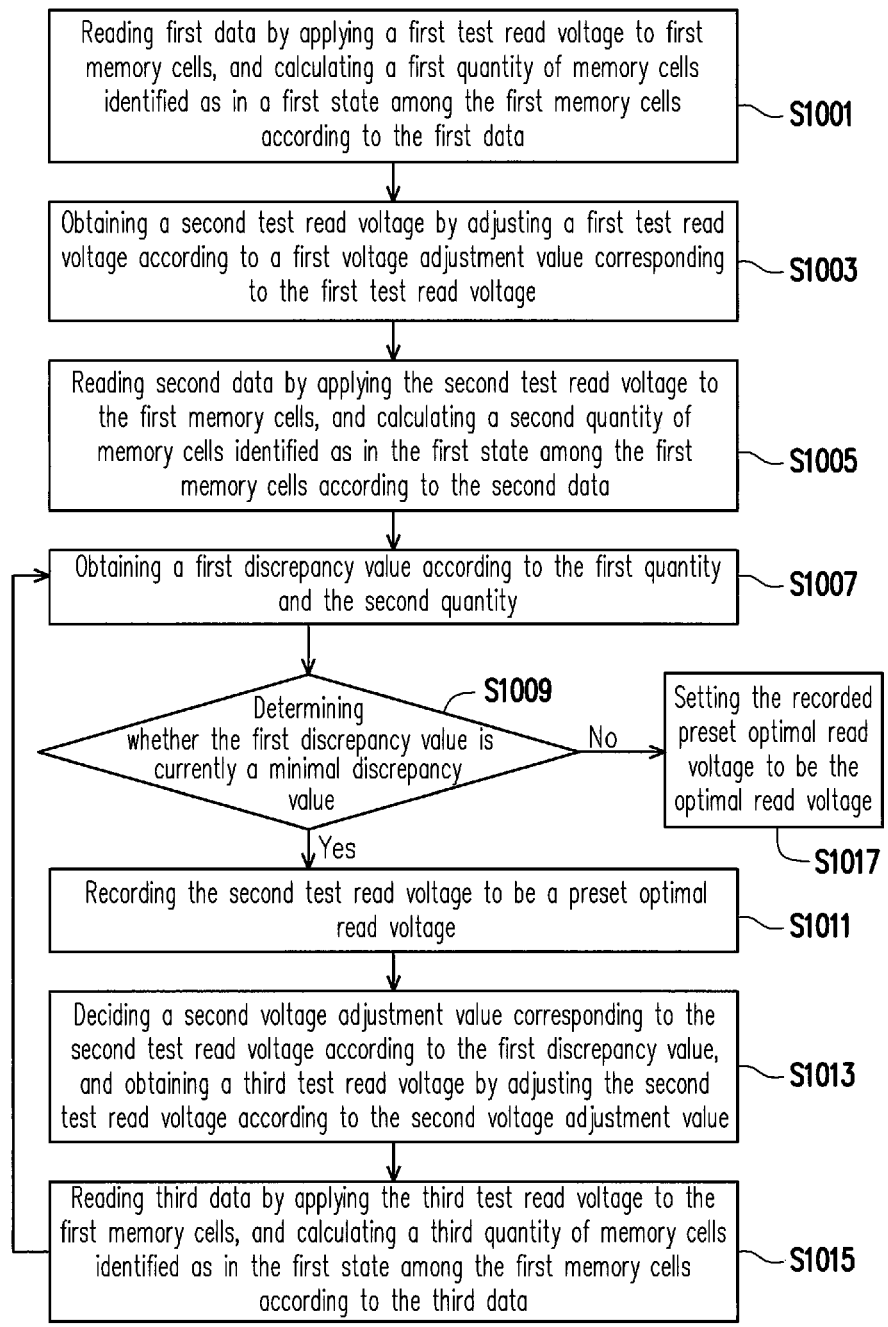
FIG. 10 is a flowchart illustrating a read voltage tracking method according to another exemplary embodiment of the invention.

FIG. 10 is a flowchart illustrating a read voltage tracking method according to another exemplary embodiment of the invention.

Referring to FIG. 10, in step S1001, the memory management circuit 502 gives a read command sequence, which instructs to read first data by applying a first test read voltage to first memory cells and calculate a first quantity of memory cells identified as in a first state among the first memory cells according to the first data.

In step S1003, the memory management circuit 502 obtains a second test read voltage by adjusting a first test read voltage according to a first voltage adjustment value corresponding to the first test read voltage.

In step S1005, the memory management circuit 502 gives a read command sequence, which instructs to read second data by applying the second test read voltage to the first memory cells and calculate a second quantity of memory cells identified as in the first state among the first memory cells according to the second data.

In step S1007, the memory management circuit 502 obtains a first discrepancy value according to the first quantity and the second quantity.

In step S1009, the memory management circuit 502 determines whether the first discrepancy value is currently a minimal discrepancy value. In this step, the memory management circuit 502 can execute the determination for the minimal discrepancy value with the method according to the embodiment of FIG. 8.

If the memory management circuit 502 determines that the first discrepancy value is currently the minimal discrepancy value, the memory management circuit 502 records the second test read voltage to be a preset optimal read voltage in step S1011.

In step S1013, the memory management circuit 502 decides a second voltage adjustment value corresponding to the second test read voltage according to the first discrepancy value, and obtains a third test read voltage by adjusting the second test read voltage according to the second voltage adjustment value.

In step S1015, the memory management circuit 502 gives a read command sequence which instructs to read third data by applying the third test read voltage to the first memory cells and calculate a third quantity of memory cells identified as in the first state among the first memory cells according to the third data. Subsequently, in the present exemplary embodiment, the memory management circuit 502 can set the second quantity to be the first quantity, set the third quantity to be the second quantity and then execute step S1007 again.

In addition, after step S1009, if the memory management circuit 502 determines that the first discrepancy value is currently not the minimal discrepancy value, the memory management circuit 502 proceeds to execute step S1017. In step S1017, the memory management circuit 502 sets the recorded preset optimal read voltage to be the optimal read voltage. In the present exemplary embodiment, the preset optimal read voltage is the second test read voltage.

In summary, the invention can be used to calculate the discrepancy value indicating the interval between the currently-used test read voltage and the previously-used test read voltage according to the quantity of the memory cells turned on by the applied test read voltage, and decide the voltage adjustment value for the next test read voltage to be used according to the discrepancy value. Based on the above, the voltage adjustment value for obtaining the new test read voltage can be dynamically adjusted to be larger or smaller values according to the size of the interval formed by the two test read voltages used in succession. Moreover, when it is determined that the minimal value is found, it can also be determined that the optimal read voltage is found. As a result, efficiency in searching for the optimal read voltage and accuracy of the found optimal read voltage can both be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A read voltage tracking method for a rewritable non-volatile memory module comprising a plurality of memory cells, the read voltage tracking method comprising:
    obtaining a plurality of test read voltages, wherein the test read voltages correspond to a plurality of voltage adjustment values; and
    obtaining an optimal read voltage from the test read voltages according to the voltage adjustment values,
    wherein the step of obtaining the test read voltages comprises:
    obtaining a second test read voltage among the test read voltages by adjusting a first test read voltage among the test read voltages according to a first voltage adjustment value corresponding to the first test read voltage, and obtaining a third test read voltage among the test read voltages by adjusting the second test read voltage according to a second voltage adjustment value corresponding to the second test read voltage, wherein the first test read voltage is a preset test read voltage, the first voltage adjustment value is a preset voltage adjustment value, and the first voltage adjustment value is different from the second voltage adjustment value.

2. The read voltage tracking method according to claim 1, wherein the step of obtaining the test read voltages further comprises:
reading first data by applying the first test read voltage to a plurality of first memory cells among the memory cells, and calculating a first quantity of memory cells identified as in a first state among the first memory cells according to the first data;
reading second data by applying the second test read voltage to the first memory cells, and calculating a second quantity of memory cells identified as in the first state among the first memory cells according to the second data;
obtaining a first discrepancy value according to the first quantity and the second quantity; and
deciding the second voltage adjustment value according to the first discrepancy value.

3. The read voltage tracking method according to claim 2, wherein the step of obtaining the first discrepancy value according to the first quantity and the second quantity comprises:
calculating a numerical difference between the first quantity and the second quantity; and
obtaining the first discrepancy value by calculating a ratio of the numerical difference to the first voltage adjustment value.

4. The read voltage tracking method according to claim 2, wherein the step of obtaining the optimal read voltage from the test read voltages according to the voltage adjustment values comprises:
determining whether the first discrepancy value is a minimal discrepancy value; and
setting the second test read voltage to be the optimal read voltage when determining that the first discrepancy value is the minimal discrepancy value.

5. The read voltage tracking method according to claim 2, wherein the step of obtaining the test read voltages further comprises:
reading third data by applying the third test read voltage to the first memory cells, and calculating a third quantity of memory cells identified as in the first state among the first memory cells according to the third data;
obtaining a second discrepancy value according to the second quantity and the third quantity; and
deciding a third voltage adjustment value corresponding to the third test read voltage according to the second discrepancy value,
wherein the first discrepancy value is greater than the second discrepancy value, and the second voltage adjustment value is greater than the third voltage adjustment value.

6. The read voltage tracking method according to claim 2, further comprising:
setting a voltage adjustment threshold,
wherein the step of deciding the second voltage adjustment value according to the first discrepancy value comprises:
deciding the second voltage adjustment value to be the voltage adjustment threshold if the second voltage adjustment value is greater than the voltage adjustment threshold.

7. A memory storage device, comprising:
a connection interface unit, configured to couple to a host system;
a rewritable non-volatile memory module comprising a plurality of memory cells;
a memory control circuit unit, coupled to the connection interface unit and the rewritable non-volatile memory module,
wherein the memory control circuit unit is configured to obtain a plurality of test read voltages, wherein the test read voltages correspond to a plurality of voltage adjustment values,
wherein the memory control circuit unit is configured to obtain an optimal read voltage from the test read voltages according to the voltage adjustment values,
wherein in the operation of obtaining the test read voltages, the memory control circuit unit is configured to obtain a second test read voltage among the test read voltages by adjusting a first test read voltage among the test read voltages according to a first voltage adjustment value corresponding to the first test read voltage and obtain a third test read voltage among the test read voltages by adjusting the second test read voltage according to a second voltage adjustment value corresponding to the second test read voltage, wherein the first test read voltage is a preset test read voltage, the first voltage adjustment value is a preset voltage adjustment value, and the first voltage adjustment value is different from the second voltage adjustment value.

8. The memory storage device according to claim 7, wherein in the operation of obtaining the test read voltages, the memory control circuit unit is further configured to give a read command sequence which instructs to read first data by applying the first test read voltage to a plurality of first memory cells among the memory cells and calculate a first quantity of memory cells identified as in a first state among the first memory cells according to the first data,
wherein in the operation of obtaining the test read voltages, the memory control circuit unit is further configured to give another read command sequence which instructs to read second data by applying the second test read voltage to the first memory cells and calculate a second quantity of memory cells identified as in the first state among the first memory cells according to the second data,
wherein in the operation of obtaining the test read voltages, the memory control circuit unit is further configured to obtain a first discrepancy value according to the first quantity and the second quantity and decide the second voltage adjustment value according to the first discrepancy value.

9. The memory storage device according to claim 8, wherein in the operation of obtaining the first discrepancy value according to the first quantity and the second quantity, the memory control circuit unit is configured to calculate a numerical difference between the first quantity and the second quantity and obtain the first discrepancy value by calculating a ratio of the numerical difference to the first voltage adjustment value.

10. The memory storage device according to claim 8, wherein in the operation of obtaining the optimal read voltage from the test read voltages according to the voltage adjustment values, the memory control circuit unit is configured to determine whether the first discrepancy value is a minimal discrepancy value, and the memory control circuit unit is configured to set the second test read voltage to be the optimal read voltage when determining that the first discrepancy value is the minimal discrepancy value.

11. The memory storage device according to claim 8, wherein in the operation of obtaining the test read voltages, the memory control circuit unit is further configured to give another read command sequence which instructs to read third data by applying the third test read voltage to the first memory cells and calculate a third quantity of memory cells identified as in the first state among the first memory cells according to the third data,
wherein in the operation of obtaining the test read voltages, the memory control circuit unit is further configured to obtain a second discrepancy value according to the second quantity and the third quantity and decide a third voltage adjustment value corresponding to the third test read voltage according to the second discrepancy value,
wherein the first discrepancy value is greater than the second discrepancy value, and the second voltage adjustment value is greater than the third voltage adjustment value.

12. The memory storage device according to claim 8, wherein the memory control circuit unit is further configured to set a voltage adjustment threshold,
wherein in the operation of deciding the second voltage adjustment value according to the first discrepancy value, the memory control circuit unit is configured to decide the second voltage adjustment value to be the voltage adjustment threshold if the second voltage adjustment value is greater than the voltage adjustment threshold.

13. A memory control circuit unit for controlling a rewritable non-volatile memory module comprising a plurality of memory cells, the memory control circuit unit comprising:
a host interface, configured to couple to a host system;
a memory interface, configured to couple to the rewritable non-volatile memory module; and
a memory management circuit, coupled to the host interface and the memory interface;
wherein the memory management circuit is configured to obtain a plurality of test read voltages, wherein the test read voltages correspond to a plurality of voltage adjustment values,
wherein the memory management circuit is configured to obtain an optimal read voltage from the test read voltages according to the voltage adjustment values,
wherein in the operation of obtaining the test read voltages, the memory management circuit is configured to obtain a second test read voltage among the test read voltages by adjusting a first test read voltage among the test read voltages according to a first voltage adjustment value corresponding to the first test read voltage and obtain a third test read voltage among the test read voltages by adjusting the second test read voltage according to a second voltage adjustment value corresponding to the second test read voltage, wherein the first test read voltage is a preset test read voltage, the first voltage adjustment value is a preset voltage adjustment value, and the first voltage adjustment value is different from the second voltage adjustment value.

14. The memory control circuit unit according to claim 13, wherein in the operation of obtaining the test read voltages, the memory management circuit is further configured to give a read command sequence which instructs to read first data by applying the first test read voltage to a plurality of first memory cells among the memory cells and calculate a first quantity of memory cells identified as in a first state among the first memory cells according to the first data,
wherein in the operation of obtaining the test read voltages, the memory management circuit is further configured to give another read command sequence which instructs to read second data by applying the second test read voltage to the first memory cells and calculate a second quantity of memory cells identified as in the first state among the first memory cells according to the second data,
wherein in the operation of obtaining the test read voltages, the memory management circuit is further configured to obtain a first discrepancy value according to the first quantity and the second quantity and decide the second voltage adjustment value according to the first discrepancy value.

15. The memory control circuit unit according to claim 14, wherein in the operation of obtaining the first discrepancy value according to the first quantity and the second quantity, the memory management circuit is configured to calculate a numerical difference between the first quantity and the second quantity and obtain the first discrepancy value by calculating a ratio of the numerical difference to the first voltage adjustment value.

16. The memory control circuit unit according to claim 14, wherein in the operation of obtaining the optimal read voltage from the test read voltages according to the voltage adjustment values, the memory management circuit is configured to determine whether the first discrepancy value is a minimal discrepancy value, and the memory management circuit is configured to set the second test read voltage to be the optimal read voltage when determining that the first discrepancy value is the minimal discrepancy value.

17. The memory control circuit unit according to claim 14, wherein in the operation of obtaining the test read voltages, the memory management circuit is further configured to give another read command sequence which instructs to read third data by applying the third test read voltage to the first memory cells and calculate a third quantity of memory cells identified as in the first state among the first memory cells according to the third data,
wherein in the operation of obtaining the test read voltages, the memory management circuit is further configured to obtain a second discrepancy value according to the second quantity and the third quantity and decide a third voltage adjustment value corresponding to the third test read voltage according to the second discrepancy value,
wherein the first discrepancy value is greater than the second discrepancy value, and the second voltage adjustment value is greater than the third voltage adjustment value.

18. The memory control circuit unit according to claim 14, wherein the memory management circuit is further configured to set a voltage adjustment threshold,
wherein in the operation of deciding the second voltage adjustment value according to the first discrepancy value, the memory management circuit is configured to decide the second voltage adjustment value to be the voltage adjustment threshold if the second voltage adjustment value is greater than the voltage adjustment threshold.

* * * * *